(12) United States Patent
Kim et al.

(10) Patent No.: US 6,984,879 B2
(45) Date of Patent: Jan. 10, 2006

(54) CLAMP FOR PATTERN RECOGNITION

(75) Inventors: Song Hak Kim, Seoul (KR); Hun Kil Cho, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 589 days.

(21) Appl. No.: 09/758,332

(22) Filed: Jan. 10, 2001

(65) Prior Publication Data
US 2001/0053244 A1    Dec. 20, 2001

(30) Foreign Application Priority Data
Jun. 10, 2000  (KR)  ............................. 2000-31955
Oct. 12, 2000  (KR)  ............................. 2000-60104

(51) Int. Cl.
*H01L 23/495* (2006.01)
(52) U.S. Cl. .................. 257/676; 257/666; 228/212
(58) Field of Classification Search ............ 228/212, 228/44.7; 439/73; 257/676, 680, 727, 666, 257/787, 667
See application file for complete search history.

(56) References Cited

U.S. PATENT DOCUMENTS

| 4,583,676 A * | 4/1986 | Pena et al. ................ 228/180.5 |
| 5,304,841 A * | 4/1994 | Negoro ........................ 257/667 |
| 5,406,700 A   | 4/1995 | Ito ............................... 29/827 |
| 5,517,056 A * | 5/1996 | Bigler et al. ................ 257/666 |
| 5,611,478 A * | 3/1997 | Asanasavest ............. 228/110.1 |
| 5,796,161 A * | 8/1998 | Moon ......................... 257/676 |
| 6,172,318 B1* | 1/2001 | Wang et al. ............. 219/56.21 |
| 6,334,566 B1* | 1/2002 | Ball et al. ..................... 228/4.5 |
| 6,389,653 B1* | 5/2002 | Matoba .................. 24/265 BC |
| 6,424,023 B1* | 7/2002 | Kim et al. .................. 257/666 |
| 6,467,174 B1* | 10/2002 | Kotori .......................... 30/293 |
| 6,478,211 B2* | 11/2002 | Ball et al. ..................... 228/4.5 |
| 6,577,019 B1  | 6/2003 | Roberts et al. ............. 257/797 |

FOREIGN PATENT DOCUMENTS

| JP | 02285664 | 11/1990 |
| JP | 05315496 | 11/1993 |
| KR | 1995-0025229 | 8/1995 |

OTHER PUBLICATIONS

Kim et al., U.S. Appl. No. 09/758,325, filed Jan. 10, 2001, entitled "Pattern Recognition Method".

* cited by examiner

*Primary Examiner*—S. V. Clark
(74) *Attorney, Agent, or Firm*—Gunnison, McKay & Hodgson, L.L.P.; Serge J. Hodgson

(57) ABSTRACT

A lead frame such as a normal or inverted lead frame includes an unsymmetrical part such as a gate. A clamp, for clamping the lead frame during wire bonding, includes an observation hole. The unsymmetrical part of the lead frame is visible through the observation hole. A lead eye box and a lead eye point are set on the unsymmetrical part through the observation hole. The picture inside the lead eye box is captured and compared to a control picture. Setting the lead eye box and the lead eye point on the unsymmetrical part through the observation hole allows detection of when the lead frame is inadvertently rotated at prescribed angles or when a normal lead frame and an inverted lead frame are inadvertently mixed.

15 Claims, 14 Drawing Sheets

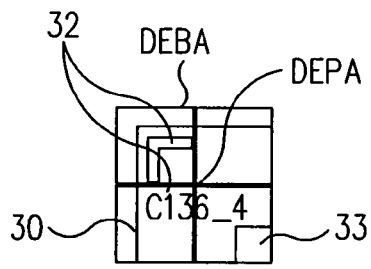
FIG. 5B
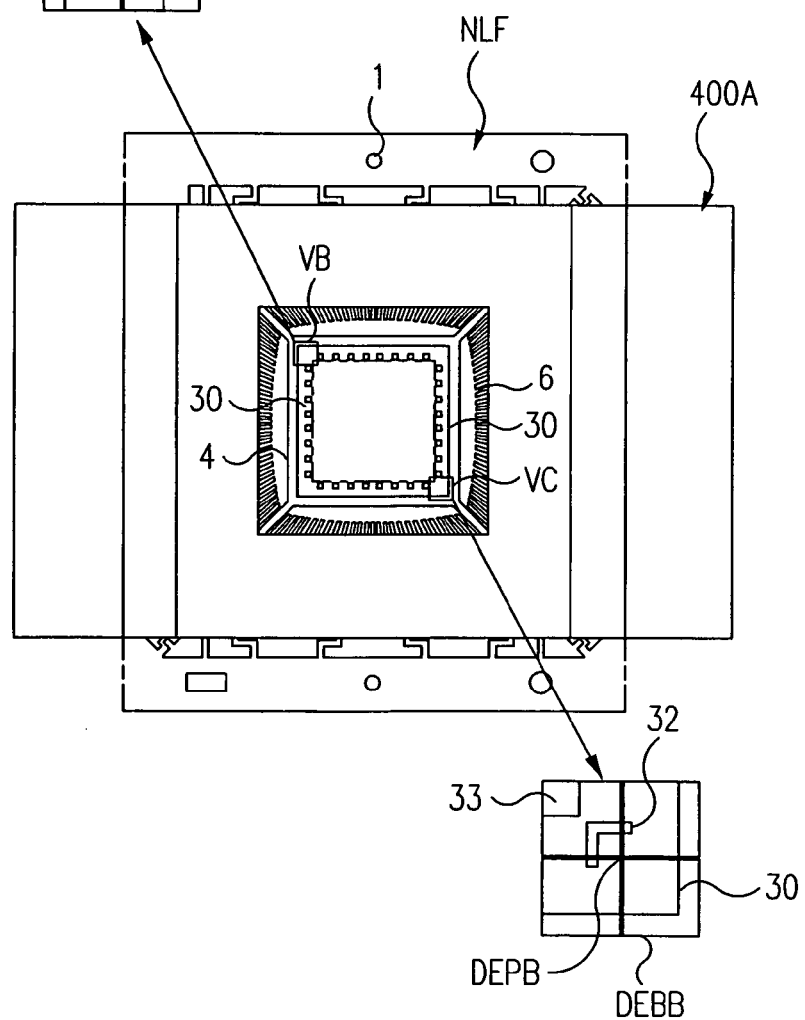
FIG. 5A
FIG. 5C

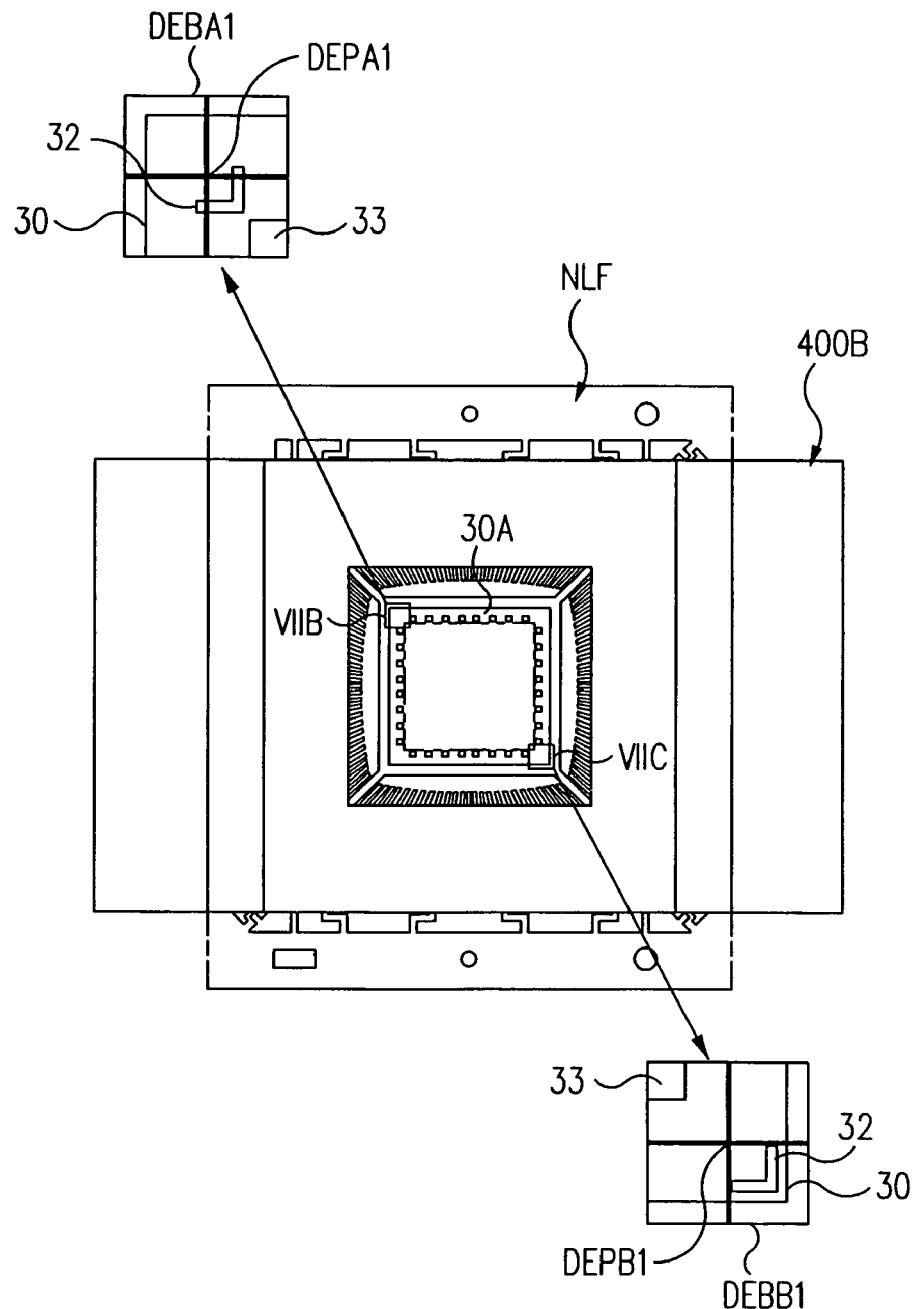

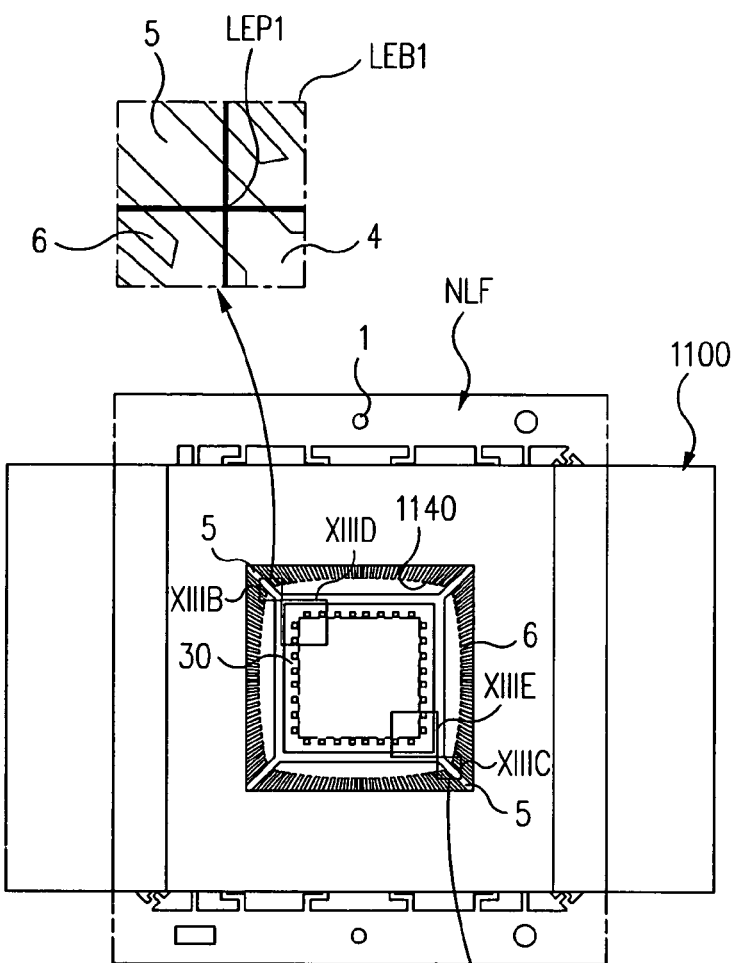
FIG. 13B
(PRIOR ART)
FIG. 13A
(PRIOR ART)
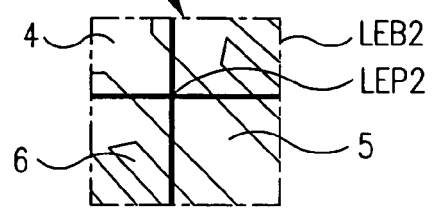
FIG. 13C
(PRIOR ART)

CLAMP FOR PATTERN RECOGNITION

BACKGROUND OF THE INVENTION

1. Field of the Invention

The present invention relates to a clamp for pattern recognition. More particularly, the present invention relates to a clamp used for clamping and detecting the orientation of a normal lead frame or an inverted lead frame during a wire bonding process and also to detecting the orientation of symmetrical dies (semiconductor chips).

2. Description of the Related Art

In general, wire bonding is a process that connects leads to each other. For example, in die wire bonding, bond pads formed on the surface of the die are electrically connected to leads of a substrate such as a printed circuit board, a circuit tape, a circuit film, a lead frame, or the like. For simplicity, the substrate shall hereinafter be referred to as a lead frame although it is understood that other substrates can be used.

A wire bonding device 900 for wire bonding is shown in FIG. 9. Wire bonding device 900 includes a camera 902 for capturing a picture, a monitor 904 for displaying the picture captured by the camera 902, a memory 906 for storing the positions of a lead frame 908 and a die (not shown), e.g., the positions are input by an initial operator, a central processing unit 910 for performing a general control such as data processing and input/output, a transfer unit 912 for transferring the lead frame 908, and a wire bond control unit 914 for moving and controlling a bond head 916, on which a capillary (not shown) and the camera 902 are mounted, in the axis of X, Y and Z. The above construction is well known.

A conventional method, which recognizes a pattern of the lead frame 908 and of the die using the wire bonding device 900 will be described as follows. First, the construction of a lead frame and a clamp used during the bonding of the lead frame will be described hereinafter.

Referring to FIG. 10A, a typical normal lead frame NLF includes a space 3 of a prescribed size formed at the center and a frame body 2 of a board type formed at both sides of the space 3 for maintaining and supporting the whole structure. A die pad 4 of a rectangular board type to mount a die 30 during the manufacturing process is disposed at the center of the space 3. The die pad 4 has four edges, to which ends of four tie bars 5 are connected respectively. Three of the tie bars 5 are connected to buffing connection boards 18 at the other ends respectively. The buffing connection boards 18 are connected to the frame body 2. The other of the tie bars 5 is connected to a gate 16 (shown at the upper and left edge of FIG. 10A) serving to make resin easily flow toward the die pad 4 during the manufacturing process (molding step). The gate 16 is connected to the frame body 2.

Here, the gate 16 has a dent part 16A formed at one side thereof to indicate the position of the gate 16 and to allow the normal lead frame NLF to be easily discriminated from an inverted lead frame (ILF), which will be described hereinafter. Moreover, each of the tie bars 5 is bent downwardly with a prescribed slant in a specific area in such a manner that the die pad 4, which is connected and supported by the tie bars 5 is located at a lower area than the frame body 2, i.e., is downset.

Meanwhile, a plurality of inner leads 6 are arranged around the die pad 4 radially in prescribed intervals from the die pad 4. Furthermore, the inner leads 6 are connected to a plurality of outer leads 10, respectively. Ends of the outer leads 10 are integrally connected to straight support bars 12. Additionally, the straight support bars 12 are connected to a plurality of bent support bars 14. The bent support bars 14 are connected to the frame body 2.

Between the inner leads 6 and the outer leads 10, a dambar 8 is provided at right angles to the longitudinal direction of the inner leads 6 or the outer leads 10. The dambar 8 serves to prevent resin from overflowing to the outer leads 10 during molding.

FIG. 10B is a plan view showing an example of a conventional inverted lead frame ILF. Note that the gate 16 for injecting resin (shown at the upper and right edge of FIG. 10B) is at a different location compared to the gate 16 of the normal lead frame NLF.

Illustrated in FIGS. 10A and 10B are an adhesive tape 22 for preventing the short or bending of the inner leads 6, an index hole 1 for detecting or fixing the orientation of the lead frame NLF or ILF, and a passivation layer 33, sometimes called a glass or glassification layer, coated on the surface of the die 30.

FIG. 11 is a perspective view of a conventional clamp 1100. Use of clamp 1100 with regards to normal lead frame NLF (FIG. 10A) is hereinafter described although it is understood that clamp 1100 is used with inverted lead frame ILF (FIG. 10B) in a similar manner. Referring now to FIGS. 10A and 11 together, the clamp 1100 serves to fix the normal lead frame NLF not to move during the wire bonding process in the state that the normal lead frame NLF on which the die 30 is mounted, is seated on a heater block (not shown) of the wire bonding device 900 (FIG. 9) by the transfer unit 912. The clamp 1100 has a window 1140 being in the form of a quadrangle in such a manner that a prescribed area of the die pad 4, the inner leads 6 and the tie bars 5 of the normal lead frame NLF is opened outward.

Continuously, referring now to FIGS. 12, 13A, 13B, 13C, 13D, 13E and 14, the conventional method for recognizing a pattern for wire bonding will be described.

Referring now to FIGS. 12 and 13A together, in a lead frame orientation detecting step 1202, a sensor senses index holes 1 of the normal lead frame NLF, which is loaded on the heater block (not shown) by the transfer unit 912 (FIG. 9), and it is determined whether or not the normal lead frame NLF is loaded in an exact direction. Here, if the normal lead frame NLF is loaded in the contrary direction, the position and the number of the index holes 1 are changed, and thereby the bad loaded state of the normal lead frame NLF can be sensed. Furthermore, at this time, the normal lead frame NLF is not completely clamped by the clamp 1100.

Referring now to FIGS. 12, 13A and 13B together, in a first lead frame indexing step 1204, a camera, e.g., camera 902 of FIG. 9, and a pattern recognition system (PRS), which converts a picture captured by the camera into an electric signal, set a lead eye box LEB1 and a lead eye point LEP1 on one tie bar 5, for example, on the tie bar 5 located at the upper and left end inside the window 1140 of the clamp 1100 of the normal lead frame NLF as best shown in FIG. 13B. Generally, a lead (die) eye box is an image of an area and a lead (die) eye point is a specific location, i.e., point, within the lead (die) eye box.

The camera and PRS capture the picture, and it is determined whether or not the captured picture is identical with a first control picture previously stored in the memory, e.g., in memory 906 of FIG. 9, within the permitted range. If the captured picture is identical with the first control picture stored in the memory, the next step is progressed. If the captured picture is identical with the first control picture within the permitted range, the normal lead frame NLF is moved in the axes of X and Y, e.g., horizontally and vertically in the view of FIG. 13A, to make the captured picture be identical with the first control picture. Moreover, if the captured picture is different from the first control picture beyond the permitted range, further steps are stopped and an operator's input is waited for.

Here, the PRS is the most advanced technique of picture information processing systems. The PRS is widely used for semiconductors, measuring instruments, material analysis, medical science fields and military affairs. Such PRS is applied to the semiconductor field, especially, the wire bonding device 900 (FIG. 9). The general principle of the PRS is that the control picture stored in the memory and the picture captured by the camera are compared and a determination is made whether or not the captured picture is identical with the control picture. If the captured picture is identical with the control picture to within the permitted range, the normal lead frame NLF or the camera is moved in the axes of X and Y to make the captured picture of the lead frame be identical with the control picture stored in the memory.

Referring now to FIGS. 12, 13A, 13B and 13C together, after the normal lead frame NLF is clamped with the clamp 1100, in a second lead frame indexing step 1206, the camera and the PRS set the first lead eye box LEB1 and the first lead eye point LEP1 on one tie bar 5 of the normal lead frame NLF as best shown in FIG. 13B. A determination is made as to whether or not the captured picture is identical with the first control picture stored in the memory within the permitted range. If the captured picture is identical with the first control picture stored in the memory, the next step is progressed. If the captured picture is identical with the first control picture to within the permitted range, the camera is moved in the axes of X and Y to make the captured picture be completely identical with the first control picture.

Continuously, a second lead eye box LEB2 and a second lead eye point LEP2 are set on another tie bar 5, for example, on the tie bar 5 located at the lower and right end inside the window 1140 of the clamp 1100, of the normal lead frame NLF as best shown in FIG. 13C. The picture is captured and a determination is made as to whether or not the captured picture is identical with a second control picture stored in the memory within a permitted range. If the captured picture is identical with the second control picture, the next step is progressed. If the captured picture is identical with the second control picture to within the permitted range, the camera is moved in the axes of X and Y to make the captured picture be completely identical with the second control picture.

Here, when the first and second lead eye boxes LEB1, LEB2 are set, if either of the captured pictures are different from the respective control pictures beyond the permitted range, further steps are stopped and the operator's input is waited for. That is, the operator sets the lead eye boxes LEB1, LEB2 and the lead eye points LEP1, LEP2 manually to set the normal lead frame NLF in an exact position.

In a Video Lead Locator (VLL) step 1208, the camera reads the position of each inner lead 6 of the normal lead frame NLF and stores the position in the memory.

Referring now to FIGS. 12, 13A, 13D and 13E together, in a die orientation detecting step 1210, the edge of the die 30 and two or more bond pads P formed in the vicinity of the edge of the die 30 are set as a first die eye box DEB1 and a first die eye point DEP1 as best shown in FIG. 13D. The picture is captured, and the captured picture is compared with a third control picture stored in the memory. If the captured picture is identical with the third control picture stored in the memory, the next step is progressed. If the captured picture is identical with the third control picture within the permitted range, the camera is moved in the axes of X and Y to make the captured picture be completely identical with the third control picture, and then, the next step is progressed. If the captured picture is different from the third control picture beyond the permitted range, further steps are stopped and the operator's input is waited for (the operator then finds and inputs the first die eye box DEB1 and the first die eye point DEP1 manually).

Continuously, in the same way, a second die eye box DEB2 and a second die eye point DEP2 are set in the vicinity of another edge of the die 30 as best shown in FIG. 13E. After the same steps are performed, if the captured picture is completely identical with a fourth control picture stored in the memory, the next step is progressed. If the captured picture is identical with the fourth control picture within the permitted range, the camera is moved in the axes of X and Y to make the captured picture be completely identical with the fourth control picture, and the next step is progressed. If the captured picture is different from the fourth control picture beyond the permitted range, further steps are stopped and the operator's input is waited for.

Continuously, referring now to FIG. 14, a virtual straight line 35 is drawn between die eye points DEP1, DEP2 and a central point CP of the virtual straight line 35 is compared with a control central point stored in the memory (e.g., stored in the memory by the operator when the die is loaded initially). If the central point CP is identical with the control central point within the permitted range, the next step is progressed, but if they are not identical, further steps are stopped and the operator's input is waited for.

Continuously, based on the central point CP, the positions and the coordinates of all bond pads P (i.e., bond pads P1, . . . , Pn) of the die 30 are calculated.

For example, if the position and the coordinate of a first bond pad P1 from the central point CP is calculated, the positions of the remaining bond pads P2, P3, . . . , Pn can be all calculated. In more detail, since the relative or absolute positions of all bond pads P are initially stored in the memory, if only the position of the first bond pad Pi is found, coordinates of the remaining bond pads P2, P3, . . . , Pn can be automatically found.

In FIGS. 13D, 13E and 14, probe marks 31 are formed by contacting bond pads P with a probe when the die 30 is tested in the electrical efficiency and a passivation layer 33, which protects the upper surface of the die 30 from the outside is illustrated.

Referring now to FIGS. 12, 13A, 13B, 13C, 13D and 13E, in a wire bonding step 1212, the bond pads P of the die 30 and the inner leads 6 of the normal lead frame NLF are bonded with a conductive wire using the positions and the coordinates of the die 30 and the normal lead frame NLF and the capillary of the bond head. The bonding is started from the first bond pad P1 of the die 30 and a first inner lead 6 of the normal lead frame NLF.

Even though the normal lead frame NLF or the die 30 are tilted or have error in the position, if they are within the permitted range, the bond pads P of the die 30 and the inner leads 6 of the normal lead frame NLF can be all wire-bonded.

However, the conventional pattern recognition method and clamp have the following problems.

First, the lead eye boxes LEB1, LEB2 and the lead eye points LEP1, LEP2 for the first and second lead frame indexing steps 1204, 1206 are set on the tie bars 5 located inside the window 1140 of the clamp 1100. Since the normal lead frame NLF is symmetric, if the normal lead frame NLF is inadvertently rotated at an angle of 180 degrees when it enters the wire bonding, this inadvertent rotation, sometimes called misalignment, cannot be detected. The structure of the die pad 4 and of the tie bars 5 connected to the die pad 4 shown through the window 1140 of the clamp 1100 are in a complete symmetrical form, and thereby, if the normal lead frame NLF is rotated at an angle of 180 degrees, the wire bonding device cannot detect it. Such problem occurs more frequently when the normal lead frame NLF and the inverted lead frame ILF are used together.

Even though, in the lead frame orientation detecting step 1202, the index holes 1 are counted and the direction is detected, the detection is performed inaccurately due to pollution of the normal lead frame NLF or the sensor. Therefore, there is much possibility that the misaligned normal lead frame NLF will pass the lead frame orientation detecting step 1202.

Second, since the lead eye boxes LEB1, LEB2 and the lead eye points LEP1, LEP2 are located at the center of the heater block on which heat is concentrated, the normal lead frame NLF is rapidly oxidized and the color of the normal lead frame NLF becomes similar with that of the heat block, and thereby the pictures cannot be exactly captured. That is, the picture recognition is lowered.

Third, if the die 30 is inadvertently bonded in rotation at angles of 90 degrees, 180 degrees or 270 degrees, this misalignment of the die 30 cannot be detected and the wire bonding is performed on the misaligned die 30.

That is, recently, the die 30, which has bond pads P of symmetrical type in all directions, is widely used, and sometimes, the die 30 is misaligned and bonded in rotation at prescribed angles, for example, 90 degrees, 180 degrees or 270 degrees, in a die bonding step. In that case, the position of the first bond pad Pi is changed, however, it cannot be detected through the above pattern recognition method. Therefore, the central processing unit incorrectly determines that the die 30 is bonded in the correct position and performs the wire bonding. However, actually, as the first bond pad P1 is located in a different area, the wire bonding of all bond pads P and the inner leads G goes wrong. Therefore, only during the electrical test performed after the wire bonding is finished is the defect detected thereby sharply lowering the production efficiency.

Fourth, as the bond pads P are finely pitched, the picture recognition rate by the PRS is lowered when the die eye boxes DEB1, DEB2 and the die eye points DEP1, DEP2 are set. That is, the closer the distance between the bond pads P is, the smaller the area of the bond pads P is, but the size of the probe mark 31 formed during the electrical test of the die 30 is not reduced. Therefore, if the picture inside the die eye boxes DEB1, DEB2 is converted into an electric signal, as the color of the probe mark 31 (for example, black color) takes the larger area than the color of the bond pad P (for example, white color), in the probability, all the bond pads P may be converted into electric signal of black color, and thereby the picture recognition rate is lowered. Therefore, there occurs trouble that the operator must detect orientation of the die 30 manually. Here, the probe mark 31 is a black mark formed by the contact of the probe when the efficiency and the validity of the die 30 are tested.

Fifth, the passivation layer 33 is covered on the surface of the die 30 to protect various circuits to the inside of rows in which the bond pads P are formed, and thereby the color of the surface is shown in various colors or rainbow colors. The phenomenon is more deepened by heat provided during a sawing step of a wafer or various manufacturing steps. By the change of color, the camera cannot exactly recognize the picture inside the die eye boxes DEB1, DEB2, and thereby the picture recognition rate is lowered.

SUMMARY OF THE INVENTION

In accordance with the present invention, a method of pattern recognition, which can detect a state that a lead frame is rotated at prescribed angles or the orientation of a normal lead frame and an inverted lead frame is presented.

The method improves a picture recognition rate by setting a lead eye box and a lead eye point in an area other than the central portion of a lead frame on which heat is concentrated.

Further, the method detects if the die is misaligned on a die pad, i.e., when the die is inadvertently rotated at prescribed angles (90 degrees, 180 degrees or 270 degrees). The orientation of the die is detected even though the area of the bond pads is reduced as the bond pads are pitched finely.

Further, the orientation of the die is detected even though the color of the die is changed by a passivation layer formed inside rows of bond pads of the die.

Also, in accordance with the present invention, a clamp, which clamps a lead frame, is presented.

In one embodiment, a method for recognizing a pattern comprises: a lead frame orientation detecting step of setting a first lead eye box and a first lead eye point on a gate of a lead frame through an observation hole of a clamp and setting a second lead eye box and a second lead eye point on a support bar of the lead frame located on the outer circumference of the clamp with a camera, before clamping the lead frame seated on a heater block with the clamp, and determining whether or not the lead frame is seated in an exact position; a lead frame indexing step of setting the first lead eye box and the first lead eye point on the gate and the second lead eye box and a second lead eye point on the support bar with the camera, after clamping the lead frame, and determining whether or not the lead frame is seated in the exact position; a VLL (Video Lead Locate) step of capturing the positions of leads of the lead frame newly and memorizing the positions; and a die orientation detecting step of setting die eye boxes and die eye points on two specific areas of bond pads of edges of a die and determining whether or not the die is mounted in an exact position.

In the lead frame orientation detecting step and the lead frame indexing step, the first lead eye box and the first lead eye point set on the gate are set on one of a plated layer or a dent part formed on the gate.

Moreover, the lead frame orientation detecting step further includes a step of moving the lead frame in the axes of X and Y in a prescribed distance and making the captured picture be identical with a memorized control picture completely if the captured picture inside the first lead eye box is identical with the memorized control picture within a permitted range.

Furthermore, the lead frame indexing step further includes a step of moving the camera in the axes of X and Y in a prescribed distance and making the captured picture be identical with the memorized control picture completely if the captured picture inside the first lead eye box is identical with the memorized control picture within a permitted range.

Additionally, the lead frame orientation detecting step and the lead frame indexing step, respectively, further include a step of stopping the operation and waiting for an operator's input if there is difference between the picture captured by the camera and the memorized control picture beyond the permitted range.

In another embodiment, the present invention provide a method for recognizing patterns comprises: a lead frame orientation detecting step of sensing the hole number of a lead frame seated on a heater block and determining whether or not the lead frame is seated in an exact first position; a first lead frame indexing step of setting a first lead eye box and a first lead eye point on a tiebar of the lead frame with a camera before clamping the lead frame with a clamp, and determining whether or not the lead frame is seated in the exact first position; a second lead frame indexing step of setting lead eye boxes and lead eye points on two tie bars of the lead frame with the camera after clamping the lead frame with the clamp, and redetermining whether or not the lead frame is seated in the exact first position; a VLL (Video Lead Locate) step of newly capturing the positions of leads of the lead frame with the camera and memorizing the positions; and a die orientation detecting step of setting die eye boxes and die eye points on two specific patterns of edges of a die with the camera and determining whether or not the die is mounted in an exact second position.

In yet another embodiment, a method for recognizing patterns comprises: a lead frame orientation detecting step of setting a first lead eye box and a first lead eye point on a gate of a lead frame through an observation hole of a clamp and setting a second lead eye box and a second lead eye point on a support bar of the lead frame located on the outer circumference of the clamp with a camera, before clamping the lead frame seated on a heater block with the clamp, and determining whether or not the lead frame is seated in an exact first position; a lead frame indexing step of setting the first lead eye box and the first lead eye point on the gate and setting the second lead eye box and the second lead eye point on the support bar with the camera, after clamping the lead frame, and determining whether or not the lead frame is seated in the exact first position; a VLL (Video Lead Locate) step of capturing the positions of leads of the lead frame newly and memorizing the positions; and a die orientation detecting step of setting die eye boxes and die eye points on specific patterns of edges of a die and determining whether or not the die is mounted in an exact second position.

The die orientation detecting step sets the die eye boxes and the die eye points on the specific patterns formed in the vicinity of the edges located outside the bond pads of the die. The specific patterns are pictures, figures, characters or numbers. The die orientation detecting step stops the operation and waits for an operator's input if the specific patterns are not located inside the die eye boxes.

The clamp includes a window formed to expose upward the die mounted on a die pad of the lead frame and leads on the outer circumference of the die during a wire bonding process and at least one or more observation holes formed in the outer circumference of the window to set a gate of the lead frame as a lead eye box and a lead eye point.

The clamp has observation holes located in opposite positions of the outer circumference of the window to detect the orientation not only of a normal lead frame but also of an inverted lead frame.

Advantageously, the orientation of the lead frame is exactly detected by setting the first lead eye box and the first lead eye point on specific shape parts, which are not symmetrical parts, i.e., on a plated layer or the dent part formed on the gate and the support bar of the lead frame. This allows detection of when the lead frame is inadvertently rotated at prescribed angles, for example, 180 degrees, or the normal lead frame and the inverted lead frame are inadvertently mixed.

Further, by setting the first lead eye box and the first lead eye point in an area other than the central portion of the lead frame on which heat is concentrated, the picture recognition rate of the PRS is improved.

Further, by adopting not the bond pads but the specific patterns formed at the edge of the die as a basic picture, when the symmetrical die is misalign and bonded in rotation at prescribed angles, for example, 90 degrees, 180 degrees or 270 degrees, this misalignment is detected promptly.

Also, even though the bond pads are pitched finely, since the die eye boxes and the die eye points adopt not the bond pads but the specific patterns formed at the outside of the bond pads as the basic picture, the picture recognition rate is improved.

In addition, since the die eye boxes and the die eye points are set at the outer circumference of the bond pads where the passivation layer is not formed, inaccurate picture information due to the change of the color of the passivation layer is not provided, thereby improving the picture recognition rate by the PRS.

BRIEF DESCRIPTION OF THE DRAWINGS

Further advantages of the invention can be more fully understood from the following detailed description taken in conjunction with the accompanying drawings in which:

FIG. 5A is a view illustrating a method of die orientation according to the present invention;

FIGS. 5B and 5C are enlarged plan views of the regions VB, VC, respectively, of FIG. 5A in accordance with one embodiment of the present invention;

FIG. 7A is a view illustrating a method of detecting that a die has been inadvertently rotated and bonded to a normal lead frame in accordance with the present invention;

FIGS. 7B and 7C are enlarged plan views of the regions VIIB, VIIC, respectively, of FIG. 7A in accordance with one embodiment of the present invention;

FIG. 13A is a view of a lead frame and die during orientation and indexing in accordance with the prior art;

FIGS. 13B, 13C, 13D and 13E are enlarged plan views of the regions XIIIB, XIIIC, XIIID, XIIIE, respectively, of FIG. 13A in accordance with the prior art.

DETAILED DESCRIPTION

Figure 1:
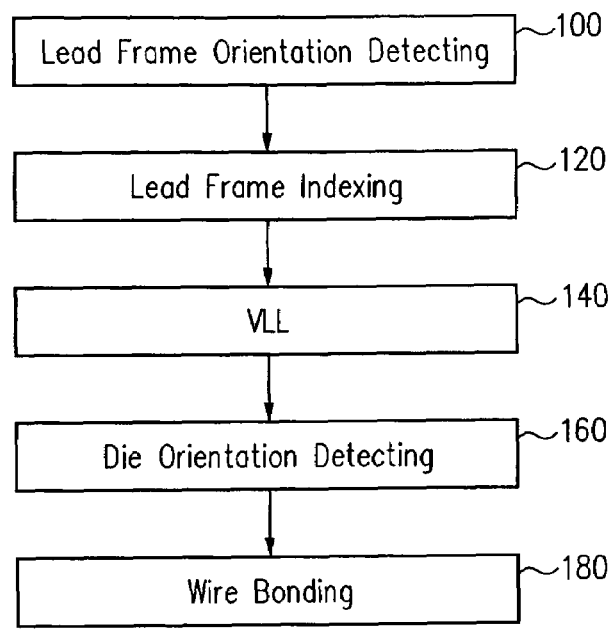
FIG. 1 is a flow chart of an embodiment of a pattern recognition method according to the present invention.

The present invention will now be described in detail in connection with various embodiments with reference to the accompanying drawings. For reference, like reference characters designate corresponding parts throughout several views.

FIG. 1 is a flow chart of a pattern recognition method according to one embodiment of the present invention.

Figure 4D:
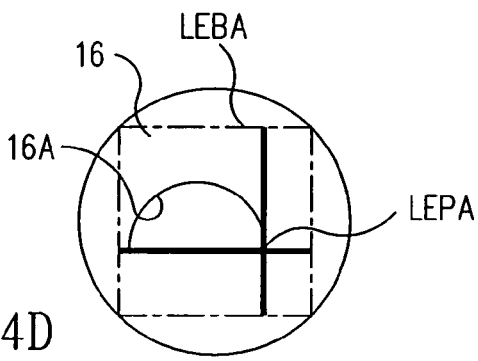
FIGS. 4B and 4D are enlarged plan views of the region IVB of FIG. 4A in accordance with alternative embodiments of the present invention.
Figure 4B:
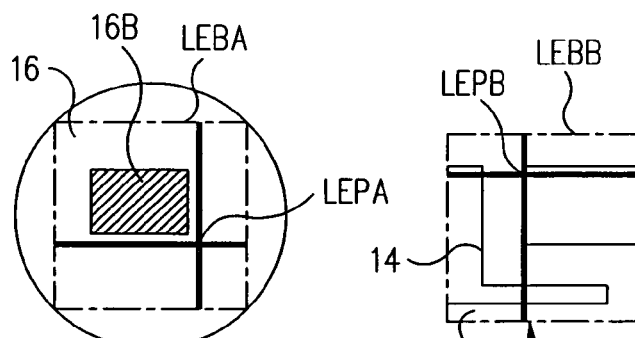
Figure 4C:
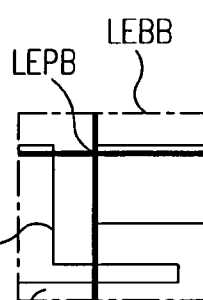
FIG. 4C is an enlarged plan view of the region IVC of FIG. 4A in accordance with one embodiment of the present invention.
Figure 4A:
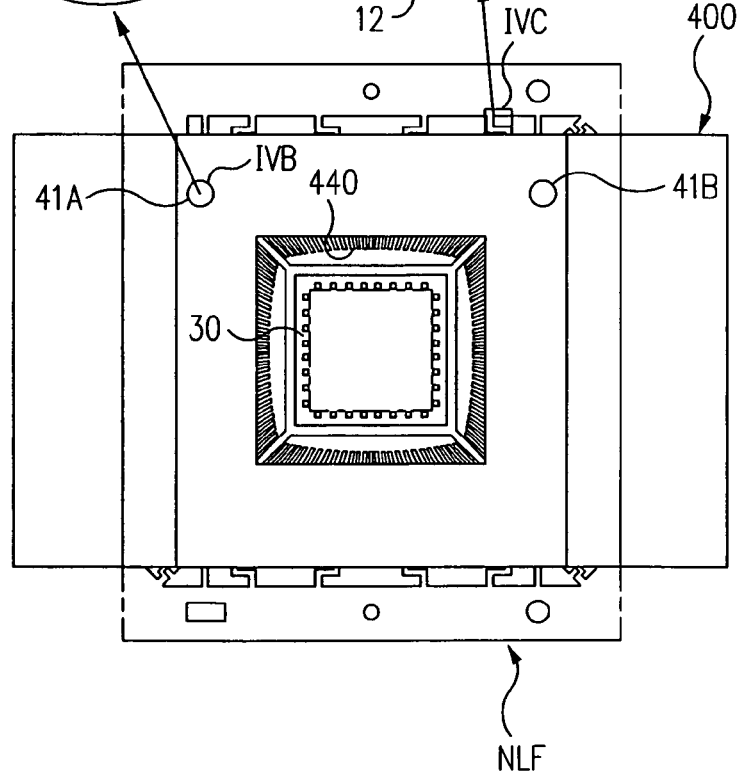
FIG. 4A is a view illustrating a method of orientation and indexing a lead frame according to the present invention.
Figure 10A:
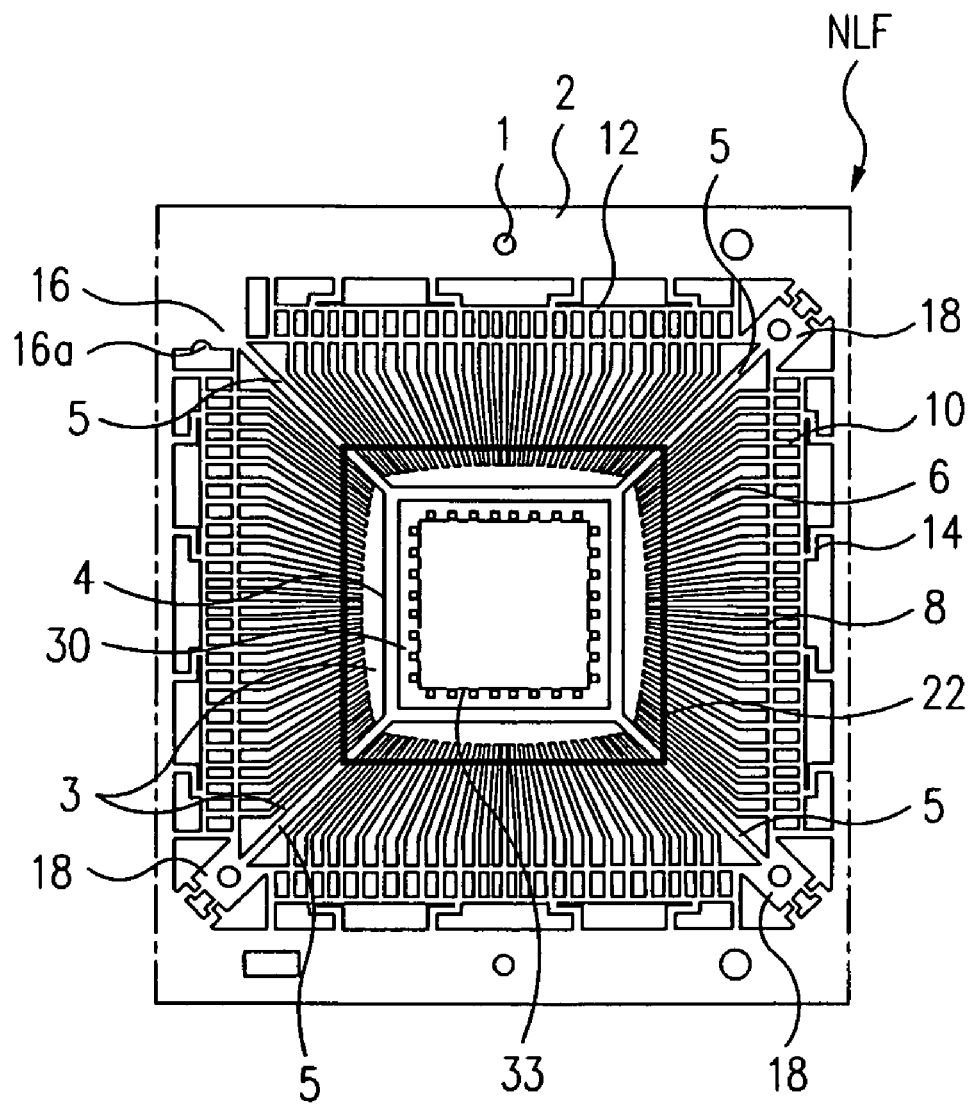
FIGS. 10A and 10B are plan views showing a die mounted to a normal lead frame and inverted lead frame, respectively, in accordance with the prior art.

1. Referring now to FIGS. 1, 4A, 4B and 4D together, in a lead frame orientation detecting step 100, a lead eye box LEBA, e.g., a first lead eye box, and a lead eye point LEPA, e.g., a first lead eye point, are set on a gate 16 of a normal lead frame NLF, e.g., such as that shown in FIG. 10A, as best shown in FIG. 4B or 4D. Further, a lead eye box LEBB, e.g., a second lead eye box, and a lead eye point LEPB, e.g., a second lead eye point, are set on a support bar 14 of the normal lead frame NLF located on the outer circumference of a clamp 400 as best shown in FIG. 4C. Specifically, gate 16 (FIG. 4B) is shown through an observation hole 41A of a clamp 400. The lead eye boxes LEBA, LEBB and the lead eye points LEPA, LEPB are set before the normal lead frame NLF, which is seated on a heater block, is clamped completely by the clamp 400. As set forth below, it is determined whether or not the normal lead frame NLF is seated in an exact direction and position, sometimes called an exact first direction and first position.

That is, first, the lead eye box LEBA and the lead eye point LEPA are set on a dent part 16A or on a plated layer 16B formed on the gate 16 of the normal lead frame NLF and the picture inside the lead eye box LEBA is captured as best shown in FIGS. 4B, 4D, respectively. A determination is made as to whether or not the captured picture is identical with a first control picture stored in a memory within a permitted range. For example, the captured picture is compared to the first control picture and the difference, if any, between the captured and first control picture is analyzed to determine if the difference is within an acceptable, sometimes called permitted, range of differences. Control pictures including the first control picture are loaded into the memory of the wire bonding device by the initial operator in a conventional manner. Further, those of skill in the art will understand that the permitted range as used herein depends on the particular lead frame, die and wire bonding device used.

If the captured and first control pictures are completely identical with each other, the next step is progressed. If the captured and first control pictures are identical with each other within the permitted range, the normal lead frame NLF is moved in the axes of X and Y to make the captured picture and the first control picture be completely identical with each other. Meanwhile, if there is difference between the captured picture and the first control picture beyond the permitted range, the operation is stopped and an operator's input is waited for. In the above case, the operator finds the gate 16 of the normal lead frame NLF and sets the lead eye box LEBA and the lead eye point LEPA manually.

Here, the plated layer 16B (FIG. 4B) is made of at least one of aluminum (Al), silver (Au), gold (Ag), palladium (Pd), nickel (Ni), lead (Pb) and tin (Sn) alloys although other materials are used in other embodiments.

Continuously, second, the lead eye box LEBB and the lead eye point LEPB (FIG. 4C) are set on the support bar 14 of the normal lead frame NLF and the picture is captured, i.e., the picture inside of the lead eye box LEBB is captured. A determination is made as to whether or not the captured picture is identical with a second control picture stored in the memory within a permitted range. If the captured and second control pictures are completely identical with each other, the next step is progressed. If the captured and second control pictures are identical with each other within the permitted range, the normal lead frame NLF is moved in the axes of X and Y to make the captured picture and the second control picture be completely identical with each other. If there is difference between the captured picture and the second control picture beyond the permitted range, the operation is stopped and the operator's input is waited for. In the above case, the operator finds the support bar 14 of the normal lead frame NLF and sets the lead eye box LEBB and the lead eye point LEPB manually.

2. In a lead frame indexing step 120, the lead eye boxes LEBA, LEBB and the lead eye points LEPA, LEPB are set again on the gate 16 and on the support bar 14, respectively, of the normal lead frame NLF by the camera after the normal lead frame NLF is completely clamped on the heater block with the clamp 400. A determination is made again as to whether or not the normal lead frame NLF is seated in the exact position to detect whether or not the position of the normal lead frame NLF changed during the clamping of the normal lead frame NLF with the clamp 400.

That is, first, the lead eye box LEBA and the lead eye point LEPA are set on the dent part 16A or the plated layer 16B formed on the gate 16 of the normal lead frame NLF as best shown in FIGS. 4D, 4B, respectively, and the picture inside of the lead eye box LEBA is captured. A determination is made as to whether or not the captured picture is identical with the first control picture stored in the memory within the permitted range. If the captured and first control pictures are completely identical with each other, the next step is progressed. If the captured and first control pictures are identical with each other within the permitted range, the camera is moved in the axes of X and Y to make the captured picture and the first control picture be completely identical with each other. Meanwhile, if there is difference between the captured picture and the first control picture beyond the permitted range, the operation is stopped and the operator's input is waited for. In the above case, the operator finds the gate 16 of the normal lead frame NLF and sets the lead eye box LEBA and the lead eye point LEPA manually.

Continuously, second, the lead eye box LEBB and the lead eye point LEPB (FIG. 4C) are set on the support bar 14 of the normal lead frame NLF and the picture inside of the lead eye box LEBB is captured. A determination is made as to whether or not the captured picture is identical with the second control picture stored in the memory within the permitted range. If the captured and second control pictures are completely identical with each other, the next step is progressed. If the captured and second control pictures are identical with each other within the permitted range, the camera is moved in the axes of X and Y to make the captured picture and the second control picture be completely identical with each other. If there is difference between the captured picture and the second control picture beyond the permitted range, the operation is stopped and the operator's input is waited for. In the above case, the operator finds the support bar 14 of the normal lead frame NLF and sets the lead eye box LEBB and the lead eye point LEPB manually.

3. In a VLL (Video Lead Locator) step 140, the positions of inner leads 6 of the normal lead frame NLF are captured by the camera newly and stored in the memory.

Figure 12:
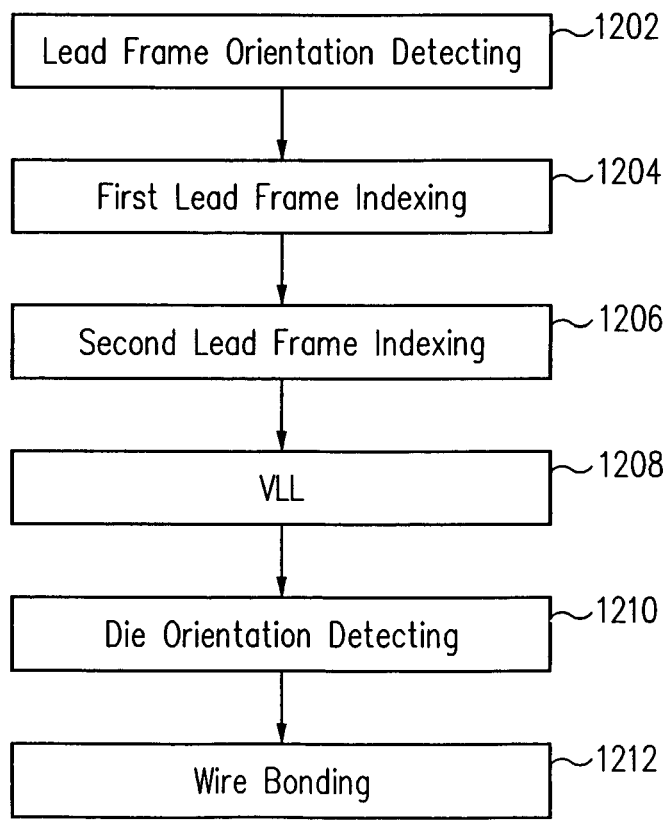
FIG. 12 is a flow chart showing a pattern recognition method in accordance with the prior art.

4. In a die orientation detecting step 160, die eye boxes and the die eye points are set on two specific areas of bond pads P of the edges of the die 30 mounted on the die pad 4 of the normal lead frame NLF by the camera, and it is determined whether or not the die 30 is mounted in an exact direction. Since the die orientation detecting step 160 is identical with the die orientation detecting step 1210 (FIG. 12) of the conventional method, its description will be omitted.

5. In a wire bonding step 180, the general wire bonding is performed in the state that the position and direction of the normal lead frame NLF and the position and direction of the die 30 are set in prescribed places.

Figure 10B:
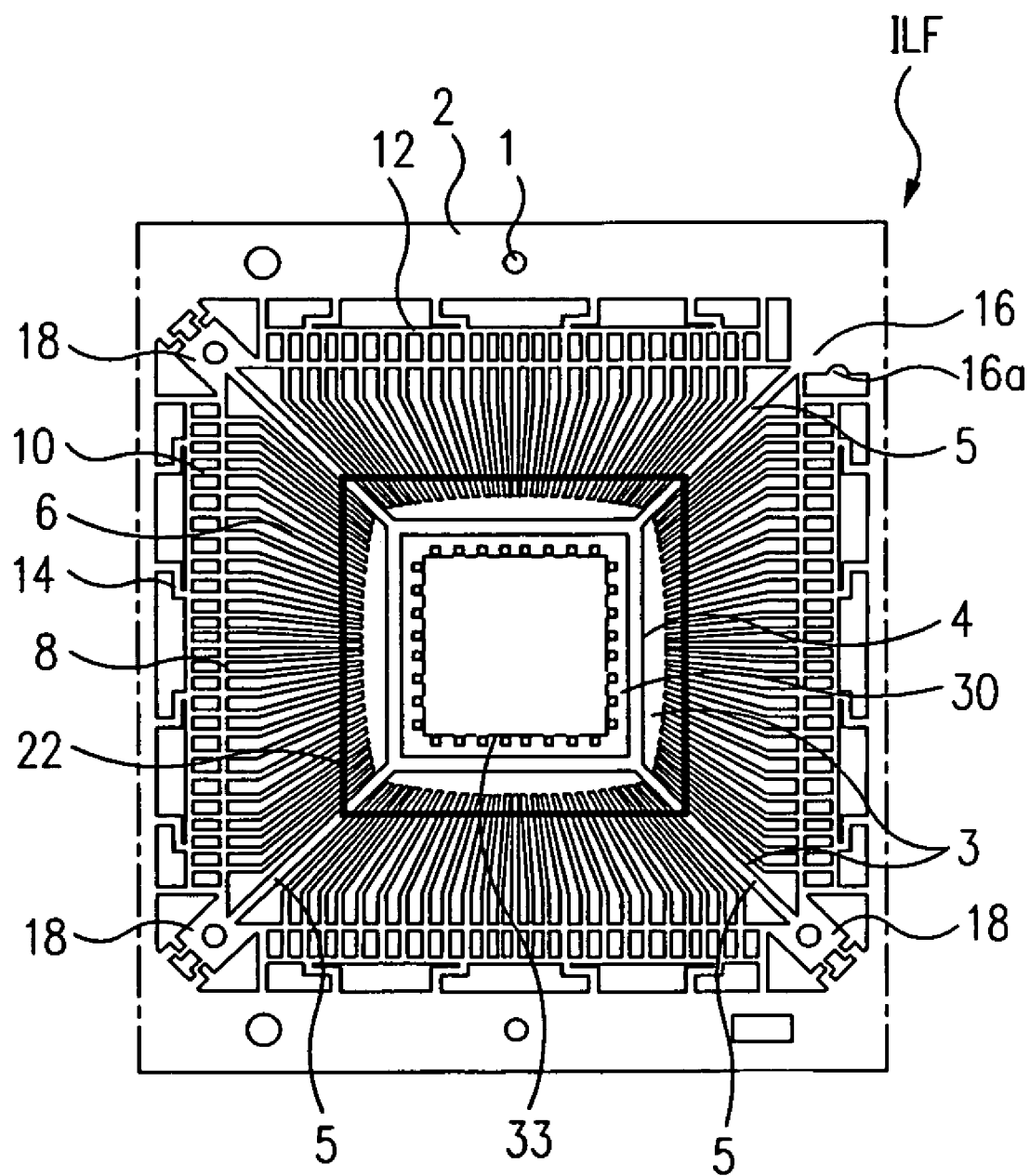
Figure 11:
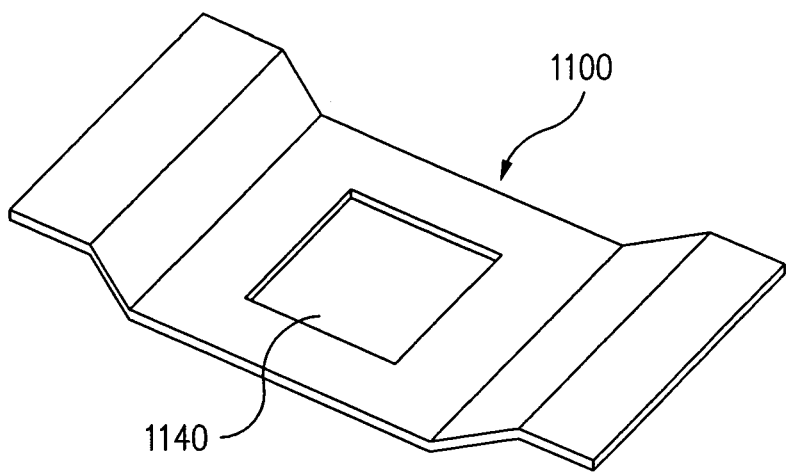
FIG. 11 is a perspective view of a clamp in accordance with the prior art.

Advantageously, the orientation of the normal lead frame NLF is exactly detected by setting the lead eye boxes LEBA, LEBB and the lead eye points LEPA, LEPB on specific shaped parts, which are not symmetrical parts, sometimes called unsymmetrical parts, i.e., on the dent part 16A (FIG. 4D) or the plated layer 16B (FIG. 4B) and the support bar 14 (FIG. 4C), respectively. This allows detection of when the normal lead frame NLF is inadvertently rotated at prescribed angles, for example, 180 degrees, or the normal lead frame NLF and an inverted lead frame ILF such as that illustrated in FIG. 10B are inadvertently mixed.

Figure 2:
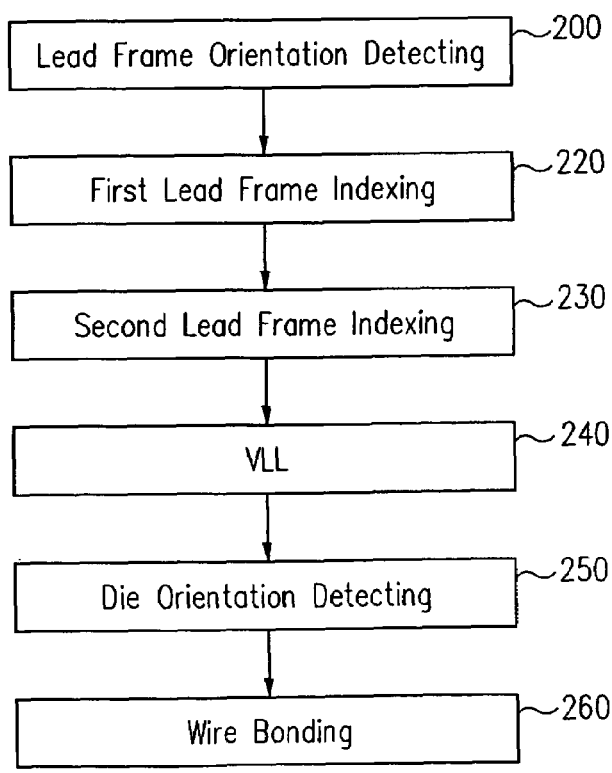
FIG. 2 is a flow chart of another embodiment of the pattern recognition method according to the present invention.

Moreover, by setting the lead eye boxes LEBA, LEBB and the lead eye points LEPA, LEPB in an area other than the central portion of the normal lead frame NLF on which heat is concentrated, the picture recognition rate of the PRS is improved. Specifically, since heat is not concentrated on the dent part 16A (FIG. 4D), the plated layer 16B (FIG. 4B), or on the support bar 14 (FIG. 4C), the dent part 16A, the plated layer 16B, and the support bar 14 do not change color thus improving the picture recognition rate compared to the prior art FIG. 2 is a flow chart of the pattern recognition method according to another embodiment of the present invention.

1. Referring now to FIGS. 2, 5A, 5B and SC, in a lead frame orientation detecting step 200, the number of index holes 1 of the normal lead frame NLF seated on the heater block is sensed by a sensor, and it is determined whether the normal lead frame NLF is seated in an exact direction. Since the lead frame orientation detecting step 200 is identical with the lead frame orientation detecting step 1202 (FIG. 12) of the conventional method, its description will be omitted.

2. In a first lead frame indexing step 220, the lead eye box and the lead eye point are set on one tie bar 5 of the normal lead frame NLF by the camera before the normal lead frame NLF is completely clamped on the heater block with the clamp 400A, and it is determined whether or not the normal lead frame NLF is seated in an exact position. As the first lead frame indexing step 220 is identical with the first lead frame indexing step 1204 (FIG. 12) of the conventional method, its description will be omitted.

3. In a second lead frame indexing step 230, the lead eye boxes and the lead eye points are set on two tie bars 5 of the normal lead frame NLF by the camera after the normal lead frame NLF is completely clamped on the heater block with the clamp 400A, and it is redetermined whether or not the normal lead frame NLF is seated in an exact position. As the second lead frame indexing step 230 is identical with the second lead frame indexing step 1206 (FIG. 12) of the conventional method, its description will be omitted.

4. In a VLL step 240, the position of each inner lead 6 of the normal lead frame NLF is newly captured by the camera and stored in the memory. As the VLL step 240 is identical with the VLL step 1208 (FIG. 12) of the conventional method, its description will be omitted.

5. In a die orientation detecting step 250, die eye boxes DEBA, DEBB and die eye points DEPA, DEPB are set on specific patterns 32 adjacent the edges of the die 30 by the camera, and it is determined whether or not the die 30 is mounted in an exact position and direction as discussed further below.

Initially, a die eye box DEBA, e.g., a first die eye box, and a die eye point DEPA, e.g., a first die eye point, are set on one edge of the die 30 by the camera as best shown in FIG. 5B.

Figure 13D:
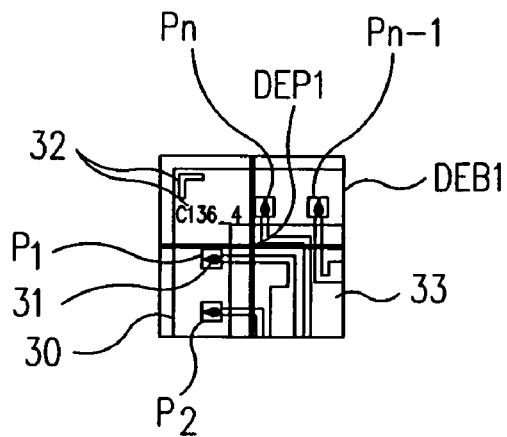
Figure 13E:
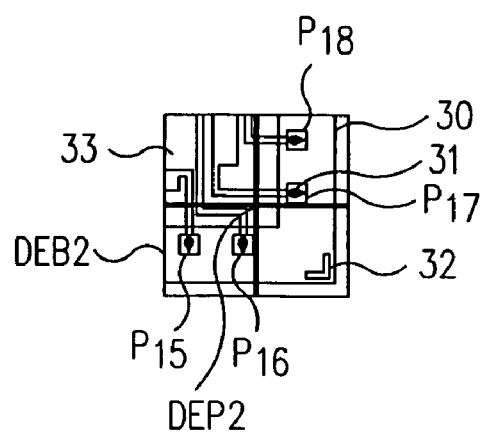
Figure 14:
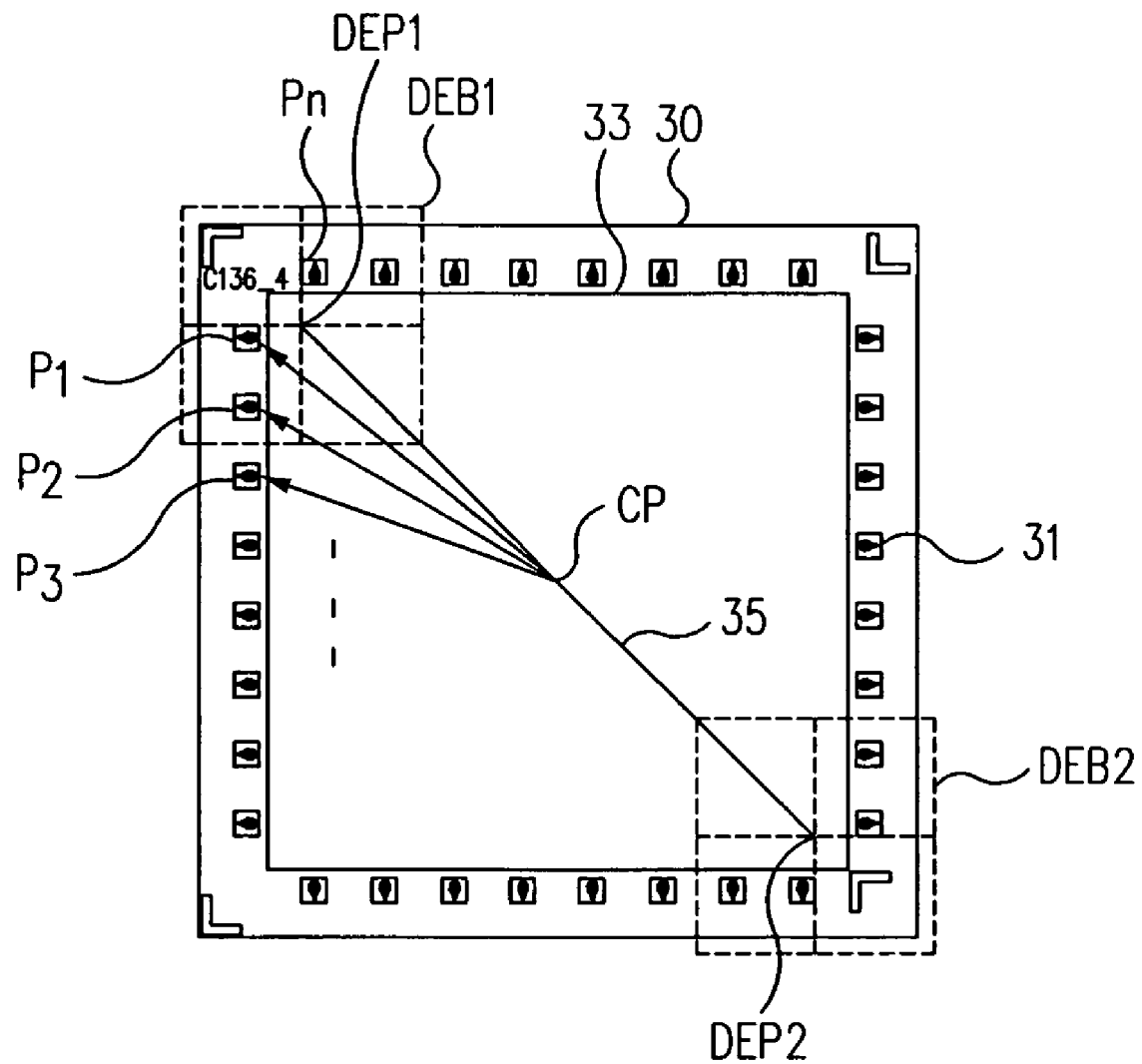
FIG. 14 is a view showing an example for calculating the position of bond pads formed on a die using a conventional pattern recognition method.

The area of the die eye box DEBA, i.e., the area set as the die eye box DEBA in the vicinity of the edge of the die 30, is within the range of 1×1 mil~6×6 mil. In contrast, in the prior art, the die eye box DEB1 (FIG. 13D) was set to have a wide area of 30×30 mil~40×40 mil and the picture inside the die eye box DEB1 was captured and collected as data. However, the die eye box DEBA of the present invention is set 1/30~6/40 times smaller than the conventional die eye box DEB1 and the picture inside the die eye box DEBA is captured and collected as data.

The captured picture is converted and compared with a third control picture stored in the memory and a determination is made as to whether the captured picture is identical with the third control picture stored in the memory. If the captured and third control pictures are completely identical with each other, the next step is progressed. If the captured and third control pictures are identical with each other within the permitted range, the camera is moved in axes of X and Y to make the captured and third control pictures be completely identical with each other. If there is a difference between the captured picture and third control picture beyond the permitted range, the operation is stopped and the operator's input is waited for.

In the above case, the operator sets the die eye box DEBA and the die eye point DEPA on the die 30 manually.

Continuously, a die eye box DEBB, e.g., a second die eye box, and a die eye point DEPB, e.g., a second die eye point, are set in the vicinity of another edge of the die 30 by the camera as best shown in FIG. 5C in a similar way, and by performing similar operations as those set forth above. A picture inside of the die eye box DEBB is captured. After that, it is determined whether or not the captured picture is identical with a fourth control picture stored in the memory.

If the captured and fourth control pictures are completely identical with each other, the next step is progressed. If the captured and fourth control pictures are identical with each other within the permitted range, the camera is moved in axes of X and Y to make the captured and fourth control pictures be completely identical with each other. If there is a difference between the captured picture and the fourth control picture beyond the permitted range, the operation is stopped and the operator's input is waited for.

Also, in the above case, the operator sets the die eye box DEBB and the die eye point DEPB on the die 30 manually.

At this time, the die eye boxes DEBA, DEBB, collectively referred to as die eye boxes DEBs, and the die eye points DEPA, DEPB, collectively referred to as die eye points DEPs, are set on the specific patterns 32 formed in the vicinity of the edges located outside of the bond pads P of the die 30, in stark contrast to the conventional method. That is, generally, in the vicinity of the edges of the die 30, the specific patterns 32 such as pictures, figures, characters or numbers having intrinsic color are formed. In other words, the specific patterns 32 formed in the vicinity of the edges of the die 30 have different shapes from each other. Therefore, if the die 30 having the symmetrical bond pads P is bonded to the die pad 4 in the state of being misalign and rotated at angles of 90 degrees, 180 degrees or 270 degrees, the captured pictures and the control pictures stored in the memory are different from each other, and thereby it is directly sensed that the die 30 is mounted in error.

Moreover, the die eye boxes DEBs and die eye points DEPs are set outside the rows, on which the bond pads P are arranged. Therefore, in stark contrast to the conventional method, in the present invention, the picture recognition rate of the PRS is prevented from being reduced by the probe marks 31 formed on the bond pads P. Namely, even though the bond pads P are pitched finely and the area of the probe marks 31 formed on the bond pads P becomes similar to the area of the bond pads P, since the die eye boxes DEBs and die eye points DEPs adopt not the bond pads P but the specific patterns 32 formed outside the bond pads P as the basic picture, the picture recognition rate of the PRS is improved.

In one embodiment, the die eye boxes DEBs and the die eye points DEPs are not overlapped With the passivation layer 33 formed inside the rows, on which the bond pads P are arranged. Therefore, in stark contrast to the conventional method, in the present invention, there is not caused the reduction of the picture recognition rate of the PRS by the change of the color of the passivation layer 33.

Figure 6:
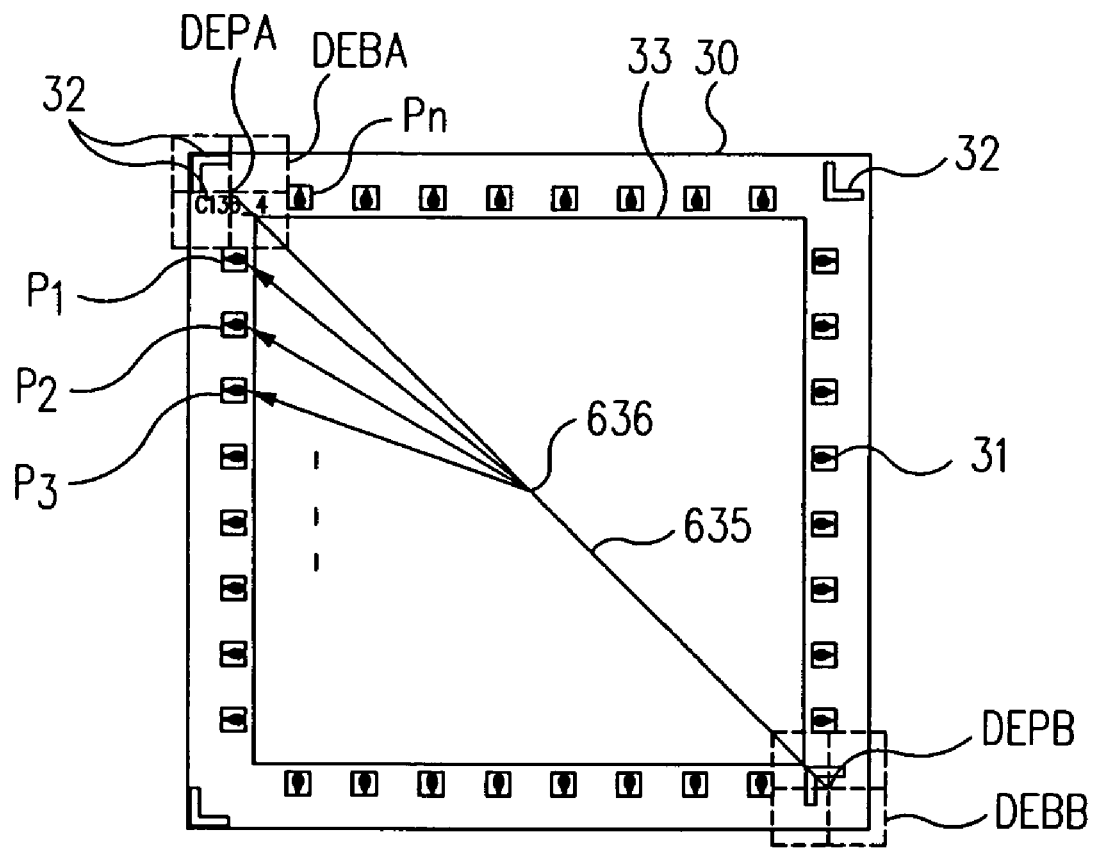
FIG. 6 is a view showing an example for calculating the position of bond pads formed on a die.

Referring now to FIG. 6, continuously, a virtual line 635 is drawn between the die eye points DEPs and a central point 636 of the virtual line 635 is compared with a control central point stored in the memory. If the central point 636 is identical with the control central point within the permitted range, the next step is progressed. If not, further steps are stopped and the operator's input is waited for. At this time, the operator moves the camera in the axes of X and Y to find the central point 636 manually.

Continuously, the position and coordinates of a first bond pad Pi is calculated on the basis of the central point 636. That is, as shown in FIG. 6, the position of the first bond pad Pi is calculated from the die eye points DEPs, and then, the positions of the remaining bond pads P2, . . . , Pn are all calculated.

In more detail, since the relative or absolute positions of the bond pads P are stored in the memory, if only the coordinate of the first bond pad Pi is found exactly, the coordinates of the remaining bond pads P2, . . . , Pn can be automatically found. Through the above method, the coordinates of all bond pads P to be bonded are calculated.

FIG. 7A shows an example of a die 30A that has been inadvertently rotated, e.g., by 90° counterclockwise, and bonded to the normal lead frame NLF, i.e., a misalign die 30A. That is, the picture set on the die eye box DEBA and the die eye point DEPA of FIG. 5B and the picture set on a first die eye box DEBA1 and a first die eye point DEPA1 of FIG. 7B are different from each other. Furthermore, the picture set on the die eye box DEBA and the die point DEPB of FIG. 5C and the picture set on a second die eye box DEBB1 and a second die eye point DEPB1 of FIG. 7C are different from each other. Therefore, it is detected that the symmetrical die 30A is incorrectly bonded on the normal lead frame NLF at prescribed angles, i.e., 90 degrees, 180 degrees or 270 degrees, and at this time, the operation is stopped promptly.

6. Referring again to FIGS. 2, 5A, 5B and 5C, in a wire bonding step 260, the general wire bonding is performed in the state that the position and direction of the normal lead frame NLF and the position and direction of the die 30 are set in prescribed positions.

Advantageously, since not the bond pads P but the specific patterns 32 formed adjacent the edges of the die 30 are adopted as the basic picture, if the symmetrical die 30 is misalign and bonded in rotation at prescribed angles of 90 degrees, 180 degrees or 270 degrees, this misalignment is detected promptly.

Moreover, even though the bond pads P are pitched finely, since the die eye boxes DEBs and the die eye points DEPs adopt not the bond pads P but the specific patterns 32 as the basic picture, the picture recognition rate of the PRS is improved. Additionally, since the die eye boxes DEBs and the die eye points DEPs are set on the outer circumference of the bond pads P, on which the passivation layer 33 is not formed, inaccurate picture information due to the change of the color of the passivation layer 33 is not provided, thereby further improving the picture recognition rate by the PRS.

Figure 3:
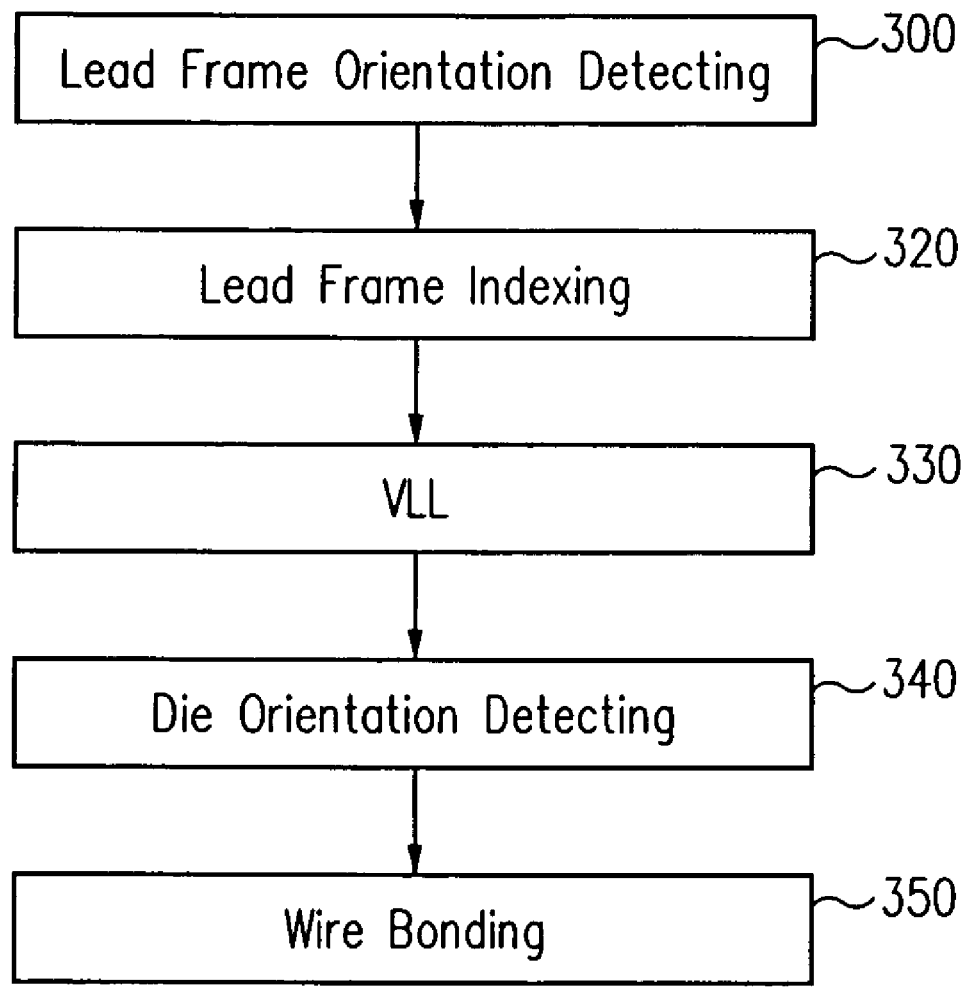
FIG. 3 is a flow chart of yet another embodiment of the pattern recognition method according to the present invention.

FIG. 3 is a flow chart of a pattern recognition method according to yet another embodiment of the present invention.

1. Referring now to FIGS. 3, 4A, 4B, 4C, and 4D, in a lead frame orientation detecting step 300, the lead eye box LEBA and the lead eye point LEPA are set on the gate 16 of the normal lead frame NLF shown through the observation hole 41A of the clamp 400. Further, the lead eye box LEBB and the lead eye point LEPB are set on the support bar 14 of the normal lead frame NLF located on the outer circumference of the clamp 400. This is accomplished by using a camera before the normal lead frame NLF seated on a heater block is clamped completely by the clamp 400. A determination is made as to whether or not the normal lead frame NLF is seated in an exact direction and position.

That is, first, the lead eye box LEBA and the lead eye point LEPA are set on a dent part 16A (FIG. 4D) or a plated layer 16B (FIG. 4B) formed on the gate 16 of the normal lead frame NLF and the picture inside the lead eye box LEBA is captured. A determination is made as to whether or not the captured picture is identical with the first control picture stored in a memory within a permitted range. If the captured and first control pictures are completely identical with each other, the next step is progressed. If the captured and first control pictures are identical with each other within the permitted range, the normal lead frame NLF is moved in the axes of X and Y to make the captured picture and the first control picture be completely identical with each other. Meanwhile, if there is difference between the captured picture and the first control picture beyond the permitted range, the operation is stopped and an operator's input is waited for. In the above case, the operator finds the gate 16 of the normal lead frame NLF and sets the lead eye box LEBA and the lead eye point LEPA manually.

Here, the plated layer 16B is made of at least one of aluminum (Al), silver (Au), gold (Ag), palladium (Pd), nickel (Ni), lead (Pb) and tin (Sn) alloys although other materials are used in other embodiments.

Continuously, second, the lead eye box LEBB and the lead eye point LEPB (FIG. 4C) are set on the support bar 14 of the normal lead frame NLF and the picture inside the lead eye box LEBB is captured. A determination is made as to whether or not the captured picture is identical with the second control picture stored in the memory within a permitted range. If the captured and second control pictures are identical with each other completely, the next step is progressed. If the captured and second control pictures are identical with each other within the permitted range, the normal lead frame NLF is moved in the axes of X and Y to make the captured picture and the second control picture be completely identical with each other. If there is difference between the captured picture and the second control picture beyond the permitted range, the operation is stopped and the operator's input is waited for. In the above case, the operator finds the support bar 14 of the normal lead frame NLF and sets the lead eye box LEBB and the lead eye point LEPB manually.

2. In a lead frame indexing step 320, the lead eye boxes LEBA, LEBB and the lead eye points LEPA, LEPB are set again on the gate 16 and on the support bar 14, respectively, of the normal lead frame NLF by the camera after the normal lead frame NLF is completely clamped on the heater block with the clamp 400. It is determined again whether or not the normal lead frame NLF is seated in the exact position to detect whether or not the position of the normal lead frame NLF changed during the clamping of the normal lead frame NLF with the clamp 400.

That is, first, the lead eye box LEBA and the lead eye point LEPA are set on the dent part 16A or the plated layer 16B formed on the gate 16 of the normal lead frame NLF as best shown in FIGS. 4D, 4B, respectively, and the picture inside the lead eye box LEBA is captured. A determination is made as to whether or not the captured picture is identical with the first control picture stored in the memory within the permitted range. If the captured and first control pictures are completely identical with each other, the next step is progressed. If the captured and first control pictures are identical with each other within the permitted range, the camera is moved in the axes of X and Y to make the captured picture and the first control picture be completely identical with each other. Meanwhile, if there is difference between the captured picture and the first control picture beyond the permitted range, the operation is stopped and an operator's input is waited for. In the above case, the operator finds the gate 16 of the normal lead frame NLF and sets the lead eye box LEBA and the lead eye point LEPA manually.

Continuously, second, the lead eye box LEBB and the lead eye point LEPB (FIG. 4C) are set on the support bar 14 of the normal lead frame NLF and the picture inside the lead eye box LEBB is captured. A determination is made as to whether or not the captured picture is identical with the second control picture stored in the memory within the permitted range. If the captured and second control pictures are completely identical with each other, the next step is progressed. If the captured and second control pictures are identical with each other within the permitted range, the camera is moved in the axes of X and Y to make the captured picture and the second control picture be completely identical with each other. If there is difference between the captured picture and the second control picture beyond the permitted range, the operation is stopped and the operator's input is waited for. In the above case, the operator finds the support bar 14 of the normal lead frame NLF and sets the lead eye box LEBB and the lead eye point LEPB manually.

3. Referring now to FIGS. 3, 5A, 5B and 5C, in a VLL (Video Lead Locator) step 330, the positions of the inner leads 6 of the normal lead frame NLF are captured by the camera newly and stored in the memory.

4. In a die orientation detecting step 340, the die eye boxes DEBA, DEBB and the die eye points DEPA, DEPB are set on the specific patterns 32 adjacent the edges of the die 30 by the camera, and it is determined whether or not the die 30 is mounted in an exact direction and position as discussed further below.

Initially, the die eye box DEBA and the die eye point DEPA are set on one edge of the die 30 by the camera as best shown in FIG. 5B.

The area of the first die eye box DEBA, i.e., the area set as the die eye box DEBA in the vicinity of the edge of the die 30, is within the range of 1×1 mil~6×6 mil. In stark contrast, in the prior art, the die eye box DEB1 was set to have a wide area of 30×30 mil~40×40 mil and the picture inside the die eye box DEB1 was captured and collected as data. However, the die eye box DEBA of the present invention is set 1/30~6/40 times smaller than the conventional die eye box DEB1 and the picture inside of the die eye box DEBA is captured and collected as data.

The captured picture is converted and is compared with the third control picture stored in the memory and a determination is made as to whether the captured picture is identical with the third control picture stored in the memory. If the captured and third control pictures are completely identical with each other, the next step is progressed. If the captured and third control pictures are identical with each other within the permitted range, the camera is moved in axes of X and Y to make the captured and third control pictures be completely identical with each other. If there is a difference between the captured picture and the third control picture beyond the permitted range, the operation is stopped and the operator's input is waited for.

In the above case, the operator sets the die eye box DEBA and the die eye point DEPA of the die 30 manually.

Continuously, the die eye box DEBB and the die eye point DEPB are set in the vicinity of another edge of the die 30 by the camera as best shown in FIG. 5C in a similar way, and by performing similar operations as those set forth above. A picture inside of the die eye box DEBB is captured. After that, it is determined whether or not the captured picture is identical with the fourth control picture stored in the memory.

If the captured and fourth control pictures are completely identical with each other, the next step is progressed. If the captured and fourth control pictures are identical with each other within the permitted range, the camera is moved in axes of X and Y to make the captured and fourth control pictures be completely identical with each other. If there is a difference between the captured picture and the fourth control picture beyond the permitted range, the operation is stopped and the operator's input is waited for.

Also in the above case, the operator sets the die eye box DEBB and the die eye point DEPB of the die 30 manually.

At this time, the die eye boxes DEBs and the die eye points DEPs are set on the specific patterns 32 formed in the vicinity of the edges located outside of the bond pads P of the die 30, in stark contrast to the conventional method. That is, generally, in the vicinity of the edges of the die 30, the specific patterns 32 such as pictures, figures, characters or numbers having intrinsic color are formed. In other words, the specific patterns 32 formed in the vicinity of the edges of the die 30 have different shapes from each other. Therefore, if the die 30 having the symmetrical bond pads P is bonded to the die pad 4 in the state of being misaligned and rotated at angles of 90 degrees, 180 degrees or 270 degrees, the captured pictures and the control pictures stored in the memory are different from each other, and thereby it is directly sensed that the die 30 is mounted in error.

Moreover, it is preferable that the die eye boxes DEBs and the die eye points DEPs are set outside the rows, on which the bond pads P are arranged. Therefore, in stark contrast to the conventional method, in the present invention, the picture recognition rate of the PRS is prevented from being reduced by the probe marks 31 formed on the bond pads P. Namely, even though the bond pads P are pitched finely and the area of the probe marks 31 formed on the bond pads P becomes similar to the area of the bond pads P, since the die eye boxes DEBs and the die eye points DEPs adopt not the bond pads P but the specific patterns 32 formed outside the bond pads P as the basic picture, the picture recognition rate of the PRS is improved.

In one embodiment, the die eye boxes DEBs and the die eye points DEPs are not overlapped with the passivation layer 33 formed inside the rows, on which the bond pads P are arranged. Therefore, in stark contrast to the conventional method, in the present invention, there is not caused the reduction of the picture recognition rate of the PRS by the change of the color of the passivation layer 33.

Referring now to FIG. 6, continuously, a virtual line 635 is drawn between the die eye points DEPs and the central point 636 of the virtual line 635 is compared with a control central point stored in the memory. If the central point 636 is identical with the control central point within the permitted range, the next step is progressed, but if not so, further steps are stopped and the operator's input is waited for. At this time, the operator moves the camera in the axes of X and Y to find the central point 636 manually.

Continuously, the position and coordinate of the first bond pad Pi is calculated on the basis of the central point 636. That is, as shown in FIG. 6, the position of the first bond pad P1 is calculated from the die eye points DEPs, and then, the positions of the remaining bond pads P2, . . . , Pn are all calculated.

In more detail, since the relative or absolute positions of the bond pads P are stored in the memory, if only the coordinates of the first bond pad Pi is found exactly, the coordinates of the remaining bond pads P2, . . . , Pn can be automatically found. Through the above method, the coordinates of all bond pads P to be bonded are calculated.

5. Referring again to FIGS. 3 and 4A, in a wire bonding step 350, the general wire bonding is performed in the state that the position and direction of the normal lead frame NLF and the position and direction of the die 30 are set in prescribed places.

Advantageously, this embodiment allows detection of when the normal lead frame NLF is inadvertently rotated at prescribed angles, for example, 180 degrees, or when the normal lead frame NLF and the inverted lead framed ILF such as that illustrated in FIG. 10B are inadvertently mixed. Specifically, this is accomplished by setting the lead eye boxes LEBA, LEBB and the lead eye points LEPA, LEPB on specific shaped parts, i.e., on the dent part 16A (FIG. 4D) or the plated layer 16B (FIG. 4B) and the support bar 14 (FIG. 4C), respectively. Thus, the orientation of the normal lead frame NLF is detected exactly.

Furthermore, by setting the lead eye boxes LEBA, LEBB and the lead eye points LEPA, LEPB in areas other than the central portion of the normal lead frame NLF on which heat is concentrated, the picture recognition rate of the PRS is improved.

Advantageously, since not the bond pads P but the specific patterns 32 formed on the edges of the die 30 are adopted as the basic picture, if the symmetrical die 30 is misaligned and bonded in rotation at prescribed angles of 90 degrees, 180 degrees or 270 degrees, this misalignment is detected promptly.

Moreover, even though the bond pads P are pitched finely, since the die eye boxes DEBs and the die eye points DEPs adopt not the bond pads P but the specific patterns 32 as the basic picture, the picture recognition rate of the PRS is improved. Additionally, since the die eye boxes DEBs and the die eye points DEPs are set on the outer circumference of the bond pads P, on which the passivation layer 33 is not formed, inaccurate picture information due to the change of the color of the passivation layer 33 is not provided thereby further improving the picture recognition rate of the PRS.

Figure 8A:
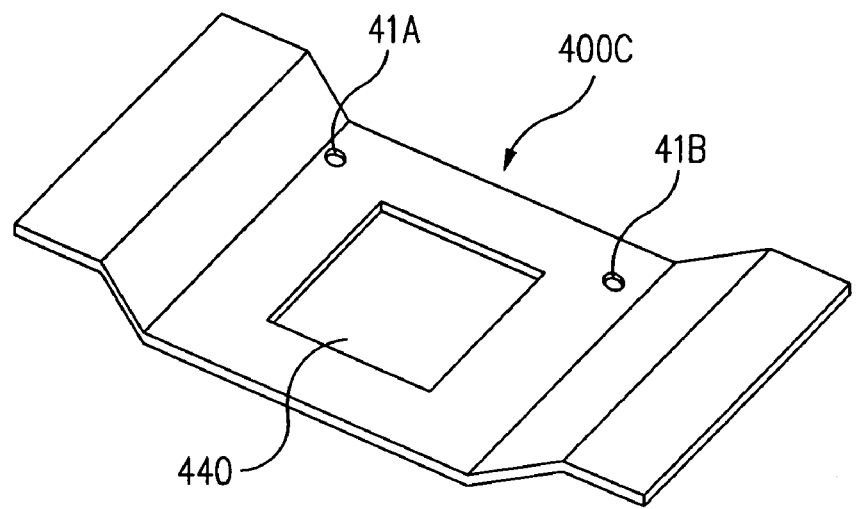
FIGS. 8A to 8C are perspective views of a clamp according to various embodiments of the present invention.
Figure 8B:
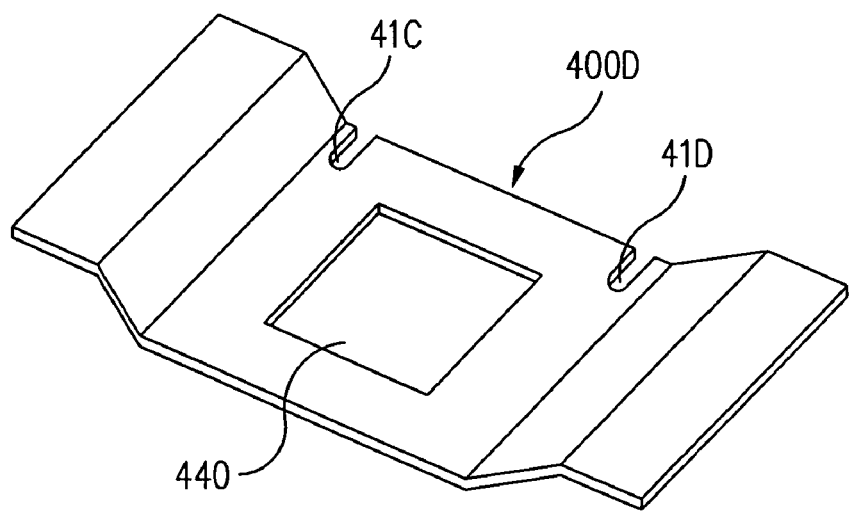
Figure 8C:
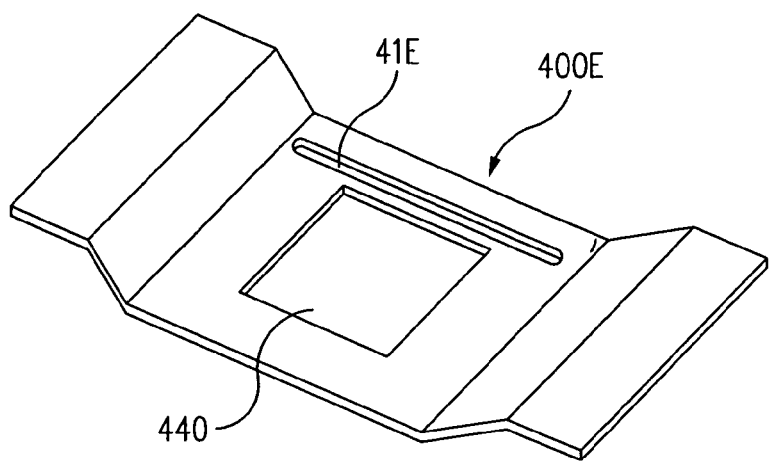
Figure 9:
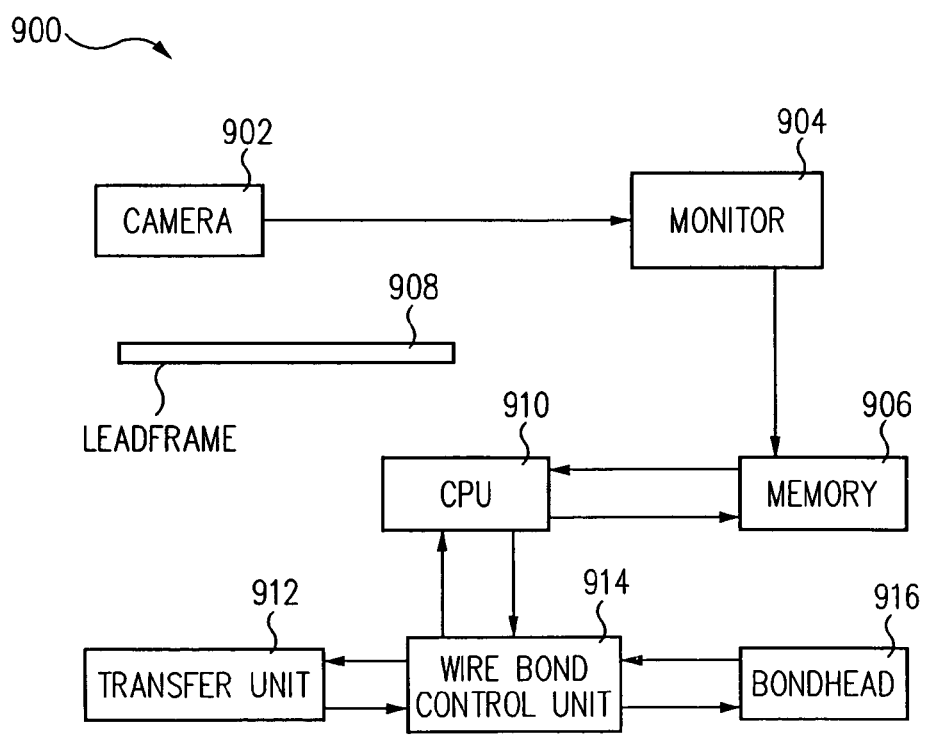
FIG. 9 is a block diagram of a construction of a wire bonding device in accordance with the prior art.

FIGS. 8A to 8C are perspective views of clamps 400C, 400D, 400E, respectively, according to various embodiments of the present invention.

As shown in FIG. 8A, the clamp 400C includes a window 440 formed at the center to expose the die and the ends of the leads adjacent to the die (not shown) upward and at least one or more observation holes 41A and 41B formed at the external circumference of the window 440 to expose the gate 16 (e.g., the plated layer 16B of FIG. 4B or the dent part 16A to the FIG. 4D) of the normal lead frame NLF. Although two observation holes 41A, 41B are illustrated, in an alternative embodiment, more or less than two observation holes 41A, 41B are used. Illustratively, two observation holes 41A, 41B are used, one, e.g., observation hole 41A, is used to expose the gate 16 of the normal lead frame NLF and the other, e.g., observation hole 41B, is used to expose the gate 16 of the inverted lead frame (ILF) such as that illustrated in FIG. 10B. Therefore, by using the clamp 400C, the orientation, detection and indexing of the normal lead frame NLF and the inverted lead frame ILF can be performed.

As shown in FIG. 8A, the observation holes 41A and 41B are two rounded through holes. Alternatively, observation holes 41C and 41D are slits as shown in FIG. 8B. As yet a further alternative, an observation hole 41E is an elongated shape as shown in FIG. 8C. The observation hole 41E shown in FIG. 8C has a length sufficient to observe each gate 16 of the normal lead frame NLF and the inverted lead frame ILF.

This application is related to Kim et al., co-filed and commonly assigned U.S. patent application Ser. No. 09/758, 325 entitled "PATTERN RECOGNITION METHOD", which is herein incorporated by reference in its entirety.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention. For example, the present invention is described in reference to a normal lead frame as the substrate to which the semiconductor dies, sometimes called chips, are mounted. However, it will be appreciated that other substrates such as an inverted lead frame, a printed circuit board, a circuit film, a circuit tape or others on which semiconductor dies are mounted may be applied to the present invention.

Advantageously, use of the method and clamp in accordance with present invention allows detection of when the lead frame is inadvertently rotated at prescribed angles, for example, 180 degrees, or when the normal lead frame and the inverted lead framed are inadvertently mixed. Specifically, this is accomplished by setting the lead eye boxes and the lead eye points on specific shaped parts, i.e., on the dent part or the plated layer of the gate and the support bar. Thus, the orientation of the lead frame is detected exactly.

Further, by setting the lead eye boxes and the lead eye points in areas other than the central portion of the lead frame on which heat is concentrated, the picture recognition rate is improved.

If the die is misaligned and bonded in rotation at prescribed angles, i.e., 90 degrees, 180 degrees or 270 degrees, this misalignment is detected promptly and further operations are not performed. Therefore, the whole production of the semiconductor packages is improved and additional steps to bond the misaligned die are not performed, thereby reducing the manufacturing cost.

Still further, even though the bond pads are pitched finely, since the die eye boxes and the die eye points adopt not the bond pads but the specific patterns as the basic picture, the picture recognition rate of the PRS is improved, and thereby the orientation of the die is detected exactly.

Moreover, since the die eye boxes and the die eye points are set on the outer circumference of the bond pads where the passivation layer is not formed, inaccurate picture information due to the change of the color of the passivation layer is not provided thereby improving the picture recognition rate of the PRS. Therefore, the orientation of the die is detected more exactly.

What is claimed is:

1. A structure for detecting the orientation of a lead frame comprising:
   the lead frame comprising:
      a gate;
      a support bar;
      a die pad, the gate serving to make resin flow towards the die pad during molding; and
      an unsymmetrical part selected from the group consisting of a dent part of the gate and a plated layer on the gate;
   a clamp, the unsymmetrical part being visible through an observation hole of the clamp; and
   a camera and pattern recognition system comprising:
      a first lead eye box and a first lead eye point on the unsymmetrical part of the lead frame, the first lead eye box comprising an image of a first area of the lead frame and the first lead eye point being a specific point within the first lead eye box; and
      a second lead eye box and a second lead eye point on the support bar of the lead frame, the second lead eye box comprising an image of a second area of the lead frame and the second lead eye point being a specific point within the second lead eye box.

2. The structure as claimed in claim 1,
   the clamp comprising:
      a window formed to expose upward a die mounted on the die pad of the lead frame and leads on an outer circumference of the die on a heater block during a wire bonding process; and
      at least one or more observation holes comprising the observation hole, the at least one or more observation holes formed in an outer circumference of the window.

3. The structure as claimed in claim 2, wherein the at least one or more observation holes are located in opposite positions of the outer circumference of the window to detect an orientation not only of a normal lead frame but also of an inverted lead frame.

4. The structure as claimed in claim 1 wherein the plated layer comprises a material selected from the group consisting of aluminum, silver, gold, palladium, nickel, lead, and tin alloys.

5. The structure as claimed in claim 1 wherein the lead frame comprises a normal lead frame.

6. The structure as claimed in claim 1 wherein the lead frame comprises an inverted lead frame.

7. The structure as claimed in claim 1 further comprising a die exposed through a window of the clamp.

8. The structure as claimed in claim 7 wherein leads of the lead frame are exposed through the window of the clamp.

9. The structure as claimed in claim 7 wherein the die is a symmetrical die.

10. The structure as claimed in claim 7 wherein the die comprises a specific pattern.

11. A structure for detecting the orientation of a lead frame comprising:
    the lead frame comprising:
       an unsymmetrical part selected from the group consisting of a dent part of a gate and a plated layer on a gate;
       a support bar;
       a die pad; and
       the gate, the gate serving to make resin flow towards the die pad during molding;
    a die mounted on the die pad;
    a clamp comprising:
       a window, the die being exposed through the window; and
       an observation hole, the unsymmetrical part being exposed through the observation hole, wherein the support bar is located on an outer circumference of the clamp; and
    a camera and pattern recognition system comprising:
       a first lead eye box and a first lead eye point on the unsymmetrical part of the lead frame, the first lead eye box comprising an image of a first area of the lead frame and the first lead eye point being a specific point within the first lead eye box; and
       a second lead eye box and a second lead eye point on the support bar of the lead frame, the second lead eye box comprising an image of a second area of the lead frame and the second lead eye point being a specific point within the second lead eye box.

12. The structure as claimed in claim 11 wherein the die comprises a specific pattern.

13. A structure for detecting the orientation of a lead frame comprising:
    the leadframe comprising:
       a gate;
       a support bar;
       a die pad, the gate serving to make resin flow towards the die pad during molding; and
       an unsymmetrical part selected from the group consisting of a dent part of the gate and a plated layer on the gate;
    a clamp comprising:
       a window formed to expose upward a die mounted on the die pad of the lead frame and leads on an outer circumference of the die; and
       an observation hole; and
    a camera and pattern recognition system comprising:
       a first lead eye box and a first lead eye point set on the unsymmetrical part of the lead frame through the observation hole, the first lead eye box comprising an image of a first area of the lead frame and the first lead eye point being a specific point within the first lead eye box.

14. The structure as claimed in claim 10 wherein the specific pattern is adjacent an edge of the die and located outside of bond pads of the die.

15. The structure as claimed in claim 1 wherein the clamp comprises:
    a window formed to expose upward a die mounted on the die pad of the lead frame and leads on an outer circumference of the die; and
    two observation holes comprising the observation hole.

* * * * *